US011145348B1

(12) United States Patent
Jaiswal et al.

(10) Patent No.: US 11,145,348 B1
(45) Date of Patent: Oct. 12, 2021

(54) CIRCUIT STRUCTURE AND METHOD FOR MEMORY STORAGE WITH MEMORY CELL AND MRAM STACK

(71) Applicant: GLOBALFOUNDRIES U.S. Inc., Santa Clara, CA (US)

(72) Inventors: Akhilesh R. Jaiswal, Falls Church, VA (US); Ajey Poovannummoottil Jacob, Watervliet, NY (US); Steven R. Soss, Saratoga Springs, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/871,129

(22) Filed: May 11, 2020

(51) Int. Cl.
   *G11C 14/00* (2006.01)
   *G11C 11/16* (2006.01)
   *G11C 7/10* (2006.01)

(52) U.S. Cl.
   CPC .......... *G11C 11/1675* (2013.01); *G11C 7/106* (2013.01); *G11C 7/1087* (2013.01); *G11C 11/1657* (2013.01); *G11C 11/1673* (2013.01); *G11C 11/1697* (2013.01)

(58) Field of Classification Search
   CPC ... G11C 11/1675; G11C 7/106; G11C 7/1087; G11C 11/1657; G11C 11/1673; G11C 11/1697
   USPC ....................................................... 365/158
   See application file for complete search history.

(56) References Cited

U.S. PATENT DOCUMENTS

2019/0325961 A1* 10/2019 Jaiswal .............. G11C 14/0081

OTHER PUBLICATIONS

Chen et al., "On the Restore Operation in MTJ-Based Nonvolatile SRAM Cells, IEEE Transactions on Very Large Scale Integration (VLSI) Systems," vol. 23, No. 11, Nov. 2015, 5 pages.
Kang et al., "Low Store Power High-Speed High-Density Nonvolatile SRAM Design With Spin Hall Effect-Driven Magnetic Tunnel Junctions," IEEE Transactions on Nanotechnology, vol. 16, No. 1, Jan. 2017, 7 pages.
Ohsawa et al., "Voltage-control spintronics memory (VoCSM) toward $4F^2$-cell with strained in-plane-MTJ," retrieved from https://www.researchgate.net/publication/332549788 on Apr. 21, 2019, 4 pages.
(Continued)

*Primary Examiner* — Xiaochun L Chen
(74) *Attorney, Agent, or Firm* — Hoffman Warnick LLC

(57) ABSTRACT

The disclosure provides a circuit structure and method for memory storage using a memory cell and magnetic random access memory (MRAM) stack. A circuit structure includes a memory cell having a first latch configured to store a digital bit, a first diode coupled to the first latch, and a first magnetic random access memory (MRAM) stack coupled to the first latch of the memory cell through the first diode. The first MRAM stack includes a first layer and a second layer each having a respective magnetic moment. The magnetic moment of the second layer is adjustable between a parallel orientation and an antiparallel orientation with respect to the magnetic moment of the first layer. Further, the magnetic anisotropy of the second layer can be modified through application of an applied voltage (VCMA effect). A spin Hall electrode is directly coupled to the first MRAM stack.

19 Claims, 4 Drawing Sheets

(56) References Cited

OTHER PUBLICATIONS

Raha et al., "Designing Energy-Efficient Intermittently Powered Systems Using Spin-Hall-Effect-Based Nonvolatile SRAM," IEEE Transactions on Very Large Scale Integration (VLSI) Systems, vol. 26, No. 2, Feb. 2018, 14 pages.
Shreya et al., "Low Restoration-Energy Differential Spin Hall Effect MRAM for High-Speed Nonvolatile SRAM Application," IEEE 20th Int'l Symposium on Quality Electronic Design, 2019, 6 pages.
Yamamoto et al., "Nonvolatile Static Random Access memory (NV-SRAM) Using Magnetic Tunnel Junctions with Current-Induced Magnetization Switching Architecture," retrieved from https://www.researchgate.net/publication/1916294 on Jul. 1, 2015, 19 pages.
Tanaka et al., "Normally-off type nonvolatile static random access memory with perpendicular spin torquw transfer-magnetic random access memory cells and smallest number of transistors," Japanese Journal of Applied Physics 53 (2014), 5 pages.

* cited by examiner though the NVM will exhibit lower access speeds than SRAM. Conventional approaches for mitigating these schemes, e.g., combining multiple types of RAM into a hybrid circuit, have proven unsatisfactory due to poor sensitivity and energy requirements that remain much higher than SRAM-only configurations. Such solutions also typically require a significant amount of surface area on an IC chip.

CIRCUIT STRUCTURE AND METHOD FOR MEMORY STORAGE WITH MEMORY CELL AND MRAM STACK

TECHNICAL FIELD

Embodiments of the disclosure relate generally to memory devices for integrated circuits (ICs). More specifically, embodiments of the disclosure provide a circuit structure and method for memory storage using a memory cell combined with a magnetic random access memory (MRAM) stack.

BACKGROUND

Random access memory (RAM) structures are important to the operation of integrated circuits (ICs). RAM refers to a collection of electrically-operated memory cells that can be read and/or written in any order, and can provide storage of working data or machine code for a device. RAM is considered to be a "volatile" form of memory, in that power is required to maintain the stored information. The two most common types of volatile RAM structures are static random access memory (SRAM) and dynamic random access memory (DRAM). Other types of RAM may include magnetic random access memory (MRAM), resistive random access memory (RRAM), and other storage elements featuring distinct operating principles and storage characteristics.

When RAM is employed in an intermittently powered device (i.e., any device which quickly shifts back and forth between being powered "off" and "on"), the RAM may be used in conjunction with various forms of non-volatile memory (NVM). The use of NVM, however, may create additional technical challenges. In an IC structure which includes both NVM and SRAM, a relatively high amount of energy may be required to implement a "checkpoint" operation for copying the SRAM data to the NVM elements. In alternative schemes which use NVM in place of SRAM for intermittently powered devices, the NVM will exhibit lower access speeds than SRAM. Conventional approaches for mitigating these schemes, e.g., combining multiple types of RAM into a hybrid circuit, have proven unsatisfactory due to poor sensitivity and energy requirements that remain much higher than SRAM-only configurations. Such solutions also typically require a significant amount of surface area on an IC chip.

SUMMARY

Aspects of the present disclosure provide a circuit structure including: a latch having a first inverter configured to store a digital bit; a first diode coupled to the first inverter of the latch; a first magnetic random access memory (MRAM) stack coupled to the first inverter of the latch through the first diode, the first MRAM stack including: a first layer and a second layer each having a respective magnetic moment, wherein the magnetic moment of the second layer is adjustable between a parallel orientation and an antiparallel orientation with respect to the magnetic moment of the first layer; and a spin Hall electrode directly coupled to the first MRAM stack.

Further aspects of the present disclosure provide a circuit structure including: a static random access memory (SRAM) cell having a first inverter configured to store a first logic voltage and a second inverter configured to store a second logic voltage; a first magnetic random access memory (MRAM) stack coupled to the first inverter of the SRAM cell through a first access transistor; a second MRAM stack coupled to the second inverter of the SRAM cell through a second access transistor, wherein each of the first MRAM stack and the second MRAM stack include: a first layer and a second layer each having a respective magnetic moment, wherein the magnetic moment of the second layer is adjustable between a parallel orientation and an antiparallel orientation with respect to the magnetic moment of the first layer, in response to an applied voltage; and a spin Hall electrode directly coupled to the first MRAM stack and the second MRAM stack.

Further aspects of the present disclosure provide a method for recording data within an integrated circuit (IC) structure, the method including: providing a circuit structure including: a latch electrically coupled to another component of the IC structure, and having a first inverter configured to store a digital bit, a first diode coupled to the first inverter, a first magnetic random access memory (MRAM) stack coupled to the first inverter of the latch through the first diode, the first MRAM stack including: a first layer having a first magnetic moment in a first orientation, and a second layer on the first layer, and having a second magnetic moment adjustable between the first orientation and a second orientation opposite the first orientation, in response to an applied voltage, and a spin Hall electrode directly coupled to the first MRAM stack; transmitting a read current across the first diode from the first inverter of the memory cell to the first MRAM stack; and transmitting a write current across the spin Hall electrode, wherein transmitting the write current records the digital bit of the memory cell within the first MRAM stack.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
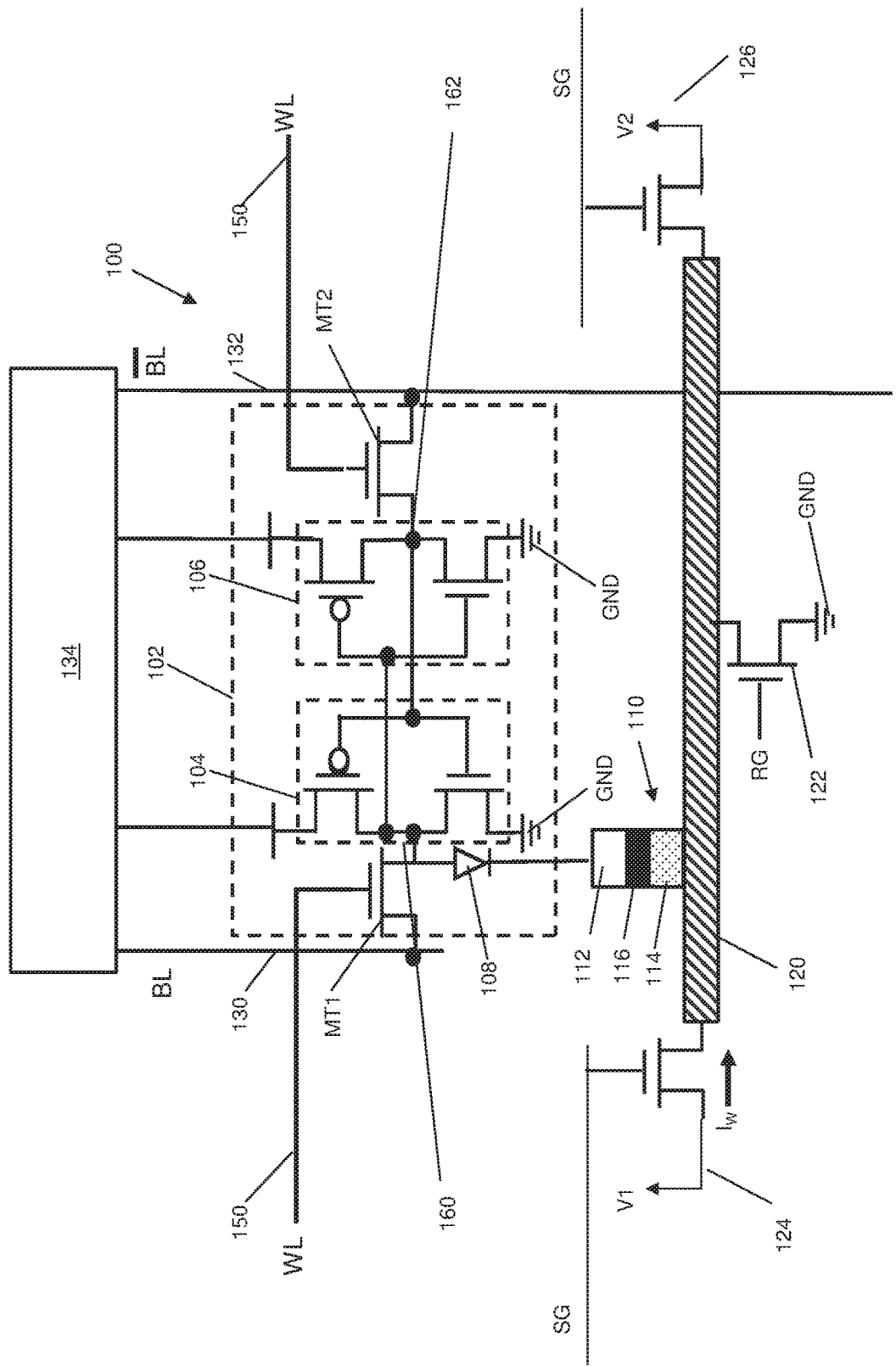
FIG. 1 shows a schematic view of a circuit structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure pertain to a circuit structure and related method for recording data within an integrated circuit (IC) structure. Embodiments of the disclosure integrate multiple types of random access memory (RAM) to provide memory "checkpointing," i.e., the ability to store digital bits in a redundant, non-volatile memory element. Embodiments of the disclosure provide this ability while also maintaining a lower operational energy and surface area than conventional memory structures. RAM refers to any type of memory cell which is designed to store data temporarily. RAM may take a variety of forms, including static RAM ("SRAM") or dynamic RAM ("DRAM"). RAM may be implemented using a wide variety of circuit structures, electronic elements, and/or device architectures. The components of RAM provide a memory cell capable of electronically storing data in the form of a binary digit, i.e., a recorded high or low voltage to implement various types of logic. During operation, the memory cells in RAM must be configured for ease of writing information (i.e., storing high and low voltages) and reading information (i.e., identifying the stored voltage in a given cell).

Embodiments of the disclosure provide a circuit structure including a memory cell (e.g., a portion of RAM) having a latch for storing a digital bit. A first diode may couple the first latch to a magnetic random access memory (MRAM) stack. The MRAM stack may be external to the memory cell structure. The MRAM stack may include a first layer (sometimes known as a "fixed layer") and a second layer (sometimes known as a "free layer"). The material composition of each layer may generate a magnetic field in a particular orientation, known as a "magnetic moment." The magnetic moment of the first layer may be fixed in one orientation. The magnetic moment of the second layer may be adjusted between a parallel orientation and an antiparallel orientation with respect to the first layer's magnetic orientation. By transmitting a "write current" through a spin Hall electrode, a threshold voltage differential may form across the MRAM stack. The voltage differential across the MRAM stack may shift the magnetic orientation of the second layer between its parallel and antiparallel states.

Further, the use of an MRAM element which exhibits Voltage Controlled Magnetic Anisotropy (VCMA) can be employed to assist or inhibit the ability of the spin hall electrode to change the first layer's magnetic orientation. Though use of a voltage differential applied across the MRAM element top and bottom electrodes, the barrier to change the free layer orientation can be raised (making it more difficult to switch/write) or lowered (increasing the ability to write/switch states).

The structure may also include a spin Hall electrode directly coupled to the first MRAM stack. A "spin Hall electrode" refers to a conductive material capable of exhibiting the "Spin Hall effect," i.e., the accumulation of "spin" (i.e., angular moment exhibited by particles) on the lateral surfaces of a material as electrical current is transmitted across the material. Such materials may include metals having a density of at least approximately five grams per cubic centimeter (g/cm$^3$). Such metals are colloquially known as "heavy metals" and may include materials such as but not limited to: tantalum (ta), osmium (Os), gold (Au), silver (Ag), cobalt (Co), etc. The spin Hall electrode material may be coupled to the first MRAM stack at one of its lateral surfaces, thus creating spin alongside the MRAM stack as currents flow through the spin Hall electrode. The accumulated spin may impart energy into the second layer of the MRAM stack. Electric currents transmitted to the MRAM stack from the diode may form a magnetic tunnel junction as current flows through the spin Hall electrode. The magnetic tunnel junction and accumulated spin, together, will selectively change the orientation of its magnetic moment between parallel and antiparallel states during the operation of the circuit. The MRAM stack being in a parallel orientation may indicate a first digital bit (which may be represented as a "high" or "low" logic voltage). The MRAM stack being in an antiparallel orientation may indicate a second, opposite digital bit and/or logic voltage.

Referring to FIG. 1, a circuit structure (simply "structure" hereafter) 100 is shown according to various embodiments of the disclosure. Structure 100 may include a latch 102, which may be embodied as an SRAM cell and/or any other currently known or later developed memory structure. Latch 102 in particular may be provided in the form of a volatile memory cell. Latch 102 of structure 100 may include a first inverter 104, and optionally, a second inverter 106, together capable of storing a digital bit in the form of a first logic voltage and a second logic voltage, respectively. A "latch" refers to an electrical data storage element formed from two cross-coupled inverting elements (e.g., a set of two transistors as shown in FIG. 1), and capable of being switched between two stable states. The two stable states of each inverter 104, 106 may correspond to two logic voltages representing a "one" or "zero," respectively. The logic voltage of one or both inverters 104, 106 may correspond to a digital bit of "one" or "zero." Each inverter 104, 106 may be electrically coupled to ground GND. In this case, the digital bit stored in latch 102 will be cleared when they are electrically disconnected from a power source.

Structure 100 may include at least a first diode 108 electrically coupled to first inverter 104. First diode 108 may provide an electrical connection between first inverter 104 and a first magnetic random access memory (MRAM) stack 110 across its opposing terminals. First diode 108 may allow electrical current to pass from first inverter 104 to first MRAM stack 110, but not in the opposite direction. During operation, first MRAM stack 110 of structure 100 may be used as a storage medium to replicate a digital bit previously stored in first inverter 104. Such an operation may be known as checkpointing, and MRAM stack 110 may function as a "backup" memory storage element for digital bits stored in latch 102 of structure 100.

First MRAM stack 110 may include, e.g., a first layer 112 and a second layer 114 separated from each other by an insulator layer 116 therebetween. First layer 112 may be known as a "fixed layer" and second layer 114 may be known as a "free layer." Insulator layer 116 may be extremely thin (e.g., approximately ten Angstroms), thereby allowing a magnetic tunnel junction to form between layers 112, 114, as discussed herein. Further, the size, shape, and composition of layer 114 may be selected such that second layer 114 will exhibit a VCMA effect during operation. Each layer 112, 114 of first MRAM stack 110 may be formed of one or more ferromagnetic metals, or more generally may include any material having a magnetic moment in a detectable orientation. At the time of manufacture, first plate 112 may be formed as a permanent magnet set to a particular polarity, while second plate 114 may have a different magnetization level. The magnetization level of second plate 114 may be selected such that applying at least a threshold voltage to first MRAM stack 110 will reorient the magnetic field of second plate 114. The reorienting of the magnetic field of second plate 114 may arise because a magnetic tunnel junction forms across insulator layer 116 when the threshold voltage is applied across first MRAM stack 110. The two magnetic moment orientations of second plate 114 may include a first orientation that is parallel to first plate 112 (i.e., a "parallel orientation") and a second orientation that is oriented oppositely with respect to first plate 112 (i.e., an "antiparallel orientation"). During operation, each of the two magnetic orientations of second plate 114 may correspond to a predetermined digital value (i.e., a "one" or "zero").

Structure 100 may include additional components for writing data to, and/or clearing data from, first MRAM stack 110. As shown, first MRAM stack 110 may be directly coupled to a spin Hall electrode 120, e.g., by being formed directly thereon. As discussed above, spin Hall electrode 120 may include metals having a density of at least approximately five grams per cubic centimeter (g/cm$^3$), e.g., one or more "heavy metals." However embodied, the composition of spin Hall electrode 120 may accumulate spin at its lateral edges when a write current $I_W$ is transmitted across spin Hall electrode 120. Spin Hall electrode 120 may be electrically coupled to ground GND through a restore transistor 122. A gate terminal RG of restore transistor 122 may control whether Spin hall electrode 120 is electrically coupled to ground GND, which in turn allows first MRAM stack 110 to undergo a "checkpointing" or "restore" operation, as described herein.

To enable the functions of random access memory, structure 100 includes a set of memory access transistors MT1, MT2 for control of read and write operations. A first memory access transistor MT1 may be coupled to first inverter 104, while a second memory access transistor MT2 may be coupled to second inverter 106. First memory access transistor MT1 may be coupled to a bitline 130 configured to have an adjustable voltage level, and second memory access transistor MT2 may be coupled to a bitline-bar 132 which also may be set to an adjustable voltage. Bitline 130 and bitline-bar 132 each may be coupled to another component (simply "component" hereafter) 134, representing one or more electrical circuits connected to structure 100. Component 134 may represent any functional device including and/or connected to one or more of, e.g., a power supply coupling, one or more digital logic circuits, one or more metal wiring layers, and/or any other device configured to interact with latch 102 of structure 100. Bitline 130 and bitline-bar 132 each may be electrically connected to other structure(s) 100 and other latches 102, but such connections are omitted from FIG. 1 for clarity of illustration.

To read memory from structure 100, bitline 130 and bitline-bar 132 are precharged and brought to a high voltage. Then, the gates of each memory access transistor MT1, MT2 are turned on. The side with an internal node set at a "low" data bit will discharge faster. An amplifier circuit (not shown) coupled to structure 100 will evaluate difference in voltage between 130 and 132, and when the difference passes a threshold value, then the lower side is considered to be a zero. In order to save (checkpoint) data in the memory cell, a diode 108 is connected to latch 102 as shown in FIG. 1. During the checkpoint operation, the access transistors MT1 and MT2 are shut off through setting a first wordline 150 coupled to first memory access transistor MT1, and a second wordline 152 coupled to second memory access transistor MT2, to a logic "low" voltage.

At this stage, the checkpoint operation may be implemented in two phases. First, terminal RG is set to a low voltage, line 124 to voltage V1 is set to a low voltage, and line 126 to voltage V2 is set to a high voltage. In alternative implementations, the same checkpointing operation may be implemented without a transistor coupled at its gate to terminal RG, and by simply setting the two voltages V1, V2 to ground and setting the voltage of terminal SG to a high voltage. When terminal SG is set to the high voltage, a high negative Iw is transmitted spin Hall electrode 120. The application of this current will set second layer 114 in MRAM cell 110 into its antiparallel state (representing, e.g., a logic "1."). The second step of the checkpoint includes setting terminal SG to low voltage, causing the voltage difference between V1 and V2 to be reversed and set to a level which will pass a smaller positive current Iw through spin Hall electrode 120. SG is again set at high voltage, and Iw is sent through spin Hall electrode 120. At this stage, MRAM stack 110 will exhibit a voltage difference between first layer 112 and second layer 114 (due to insulating layer 116). The amount of this voltage difference (between 112 and 114) will depend on the state of an internal node 160 between two transistors of first inverter 104 within latch 102. If node 160 is set the low voltage, the resulting voltage differential will cause the VCMA effect of MRAM stack 110 to lower the energy barrier for second layer 114 to switch its state. Passing current through spin Hall electrode 120 will induce a spin Hall transfer to second layer 114, switching the magnetic state to its parallel state (e.g., corresponding to logic level "0") and storing the corresponding logic level. If internal node 160 is set to a high voltage, then the VCMA effect would not be triggered, and second layer 114 would resist being switched during application of current Iw and remain in the antiparallel state (e.g., logic "1" in this example). At this point, terminal SG remains set to a low voltage Still referring to FIG. 1, structure 100 can also provide a restore operation, in which data previously recorded in MRAM stacks 110 is restored to inverters 104, 106 of latch 102. Here, bitline-bar 132 is brought to a voltage level corresponding to the midpoint of electrical resistance for MRAM cells 110. Bitline 130 is correspondingly set to a power supply voltage, indicated "Vdd"). At this point, memory access transistors MT1 and MT2 may be turned on via a high voltage applied through word lines 150, 152. Terminal SG is set to a low voltage, thereby disconnecting lines 124 and 126 from spin Hall electrode 120. Terminal RG is set to high, thereby spin Hall electrode 120 to ground. At this point, current will flow in bitline 130 through memory access transistor MT1, through diode 108, and through the MRAM stack 110 to spin Hall electrode 120 and ground. Depending on the electrical resistance of MRAM stack 110, the voltage at internal node 160 will be higher or lower than the voltage of bitline-bar 132. If MRAM stack 110 is in low resistance state (logical 0), then internal node 160 will be pulled to a lower level than an internal node 162 for second inverter 106. In this case, inverters 104, 106 will interpret internal node 160 as being "low," and node 162 for second latch 152 to be high. Conversely, where internal node 160 is at a higher voltage than node 162, inverters 104, 106 will interpret internal node 160 as being "high" and node 162 as being "low." At this point, memory access transistors MT1, MT2 are disconnected (setting word lines 150 and 152 to low voltage), and line 120 is set to "float" (i.e., V1, V2 are disconnected).

Figure 2:
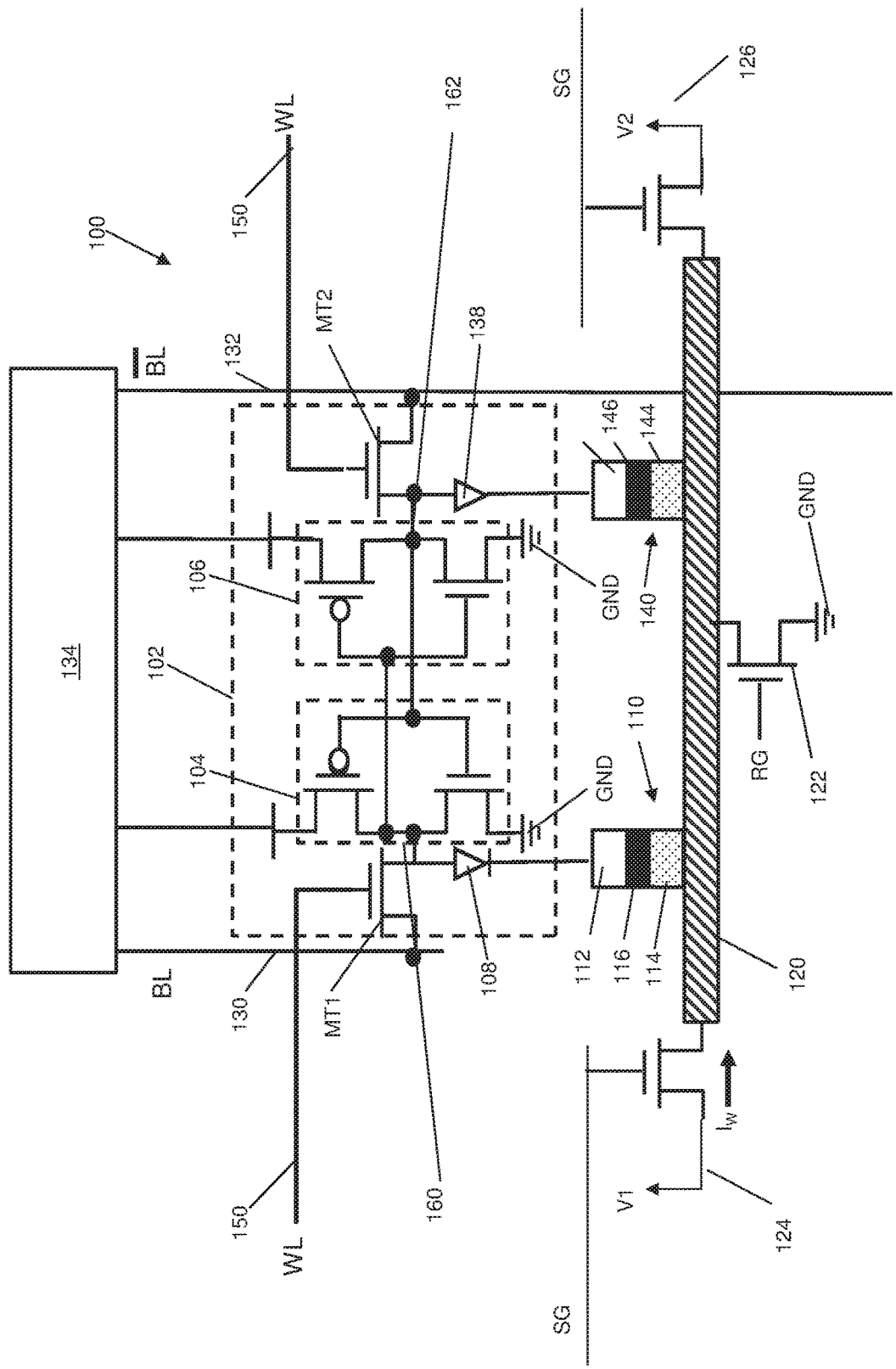
FIG. 2 shows a schematic view of a circuit structure according to further embodiments of the disclosure.

Referring to FIG. 2, further embodiments of structure 100 may include multiple MRAM elements for selectively recording digital bits from both sides of latch 102 by connecting to first inverter 104 and second inverter 106. Here, a second diode 138 may electrically couple second inverter 106 to a second MRAM stack 140. Second MRAM stack 140, in turn, may be directly electrically coupled to another portion of spin Hall electrode 120. Second MRAM stack 140 may include a third layer 142, a fourth layer 144, and an insulator layer 146 therebetween in an arrangement similar to first MRAM stack 110. Thus, second MRAM stack 140 may store a digital bit based on the parallel or antiparallel magnetic moment of fourth layer 144 therein. In this configuration, second MRAM stack 140 may be electrically coupled to, and capable of storing, the logic voltage recorded in second inverter 106.

Second MRAM stack 140 may operate independently of first MRAM stack 110 to store a logic voltage from second inverter 106, respectively. To implement a checkpointing operation in such a configuration, substantially the same process as described above relative to FIG. 1 can be used. Due to the complimentary nature of the internal nodes 160 and 162, when the checkpoint operation is completed substantially as discussed above, MRAM stacks 110 and 140 will store the logical values on each side of latch 102 and be compliments of each other. In this manner, logic levels within inverters 104, 106 will be replicated in MRAM stack(s) 110, 140, rather than each MRAM stack 110, 140 being specific to the digital bit stored within latch 102.

Again referring to FIG. 2, a user can perform a restore operation without the need of a reference voltage. To implement a restore operation, an operator may precharge both bitline 130 and bitline-bar 132 to a high voltage state. Then, word line 150 can also be set to a high voltage to allow access to the latch 102. In addition, restore transistor 122 can be set on (i.e., RG is set to high voltage), thereby grounding spin Hall electrode 120. At this point, current will flow through bit line 130, through diode 108, and through MRAM stack 110 into spin Hall electrode 120 and to ground GND. Similarly, a current will also flow through bitline-bar 132, through diode 138, though MRAM stack 140, and into spin Hall electrode 120 and to ground GND. After these processes conclude, MRAM stack 110 will be in an opposite (i.e., higher or lower) resistive state than MRAM stack 140. This, in turn, causes internal node 160 to be at the opposite voltage level from node 162. This tilt in the voltage between 160 and 162 will be reinforced through current flow in the latch 102 causing the latch to mimic the logic levels stored in MRAM cells 110 and 140.

Figure 3:
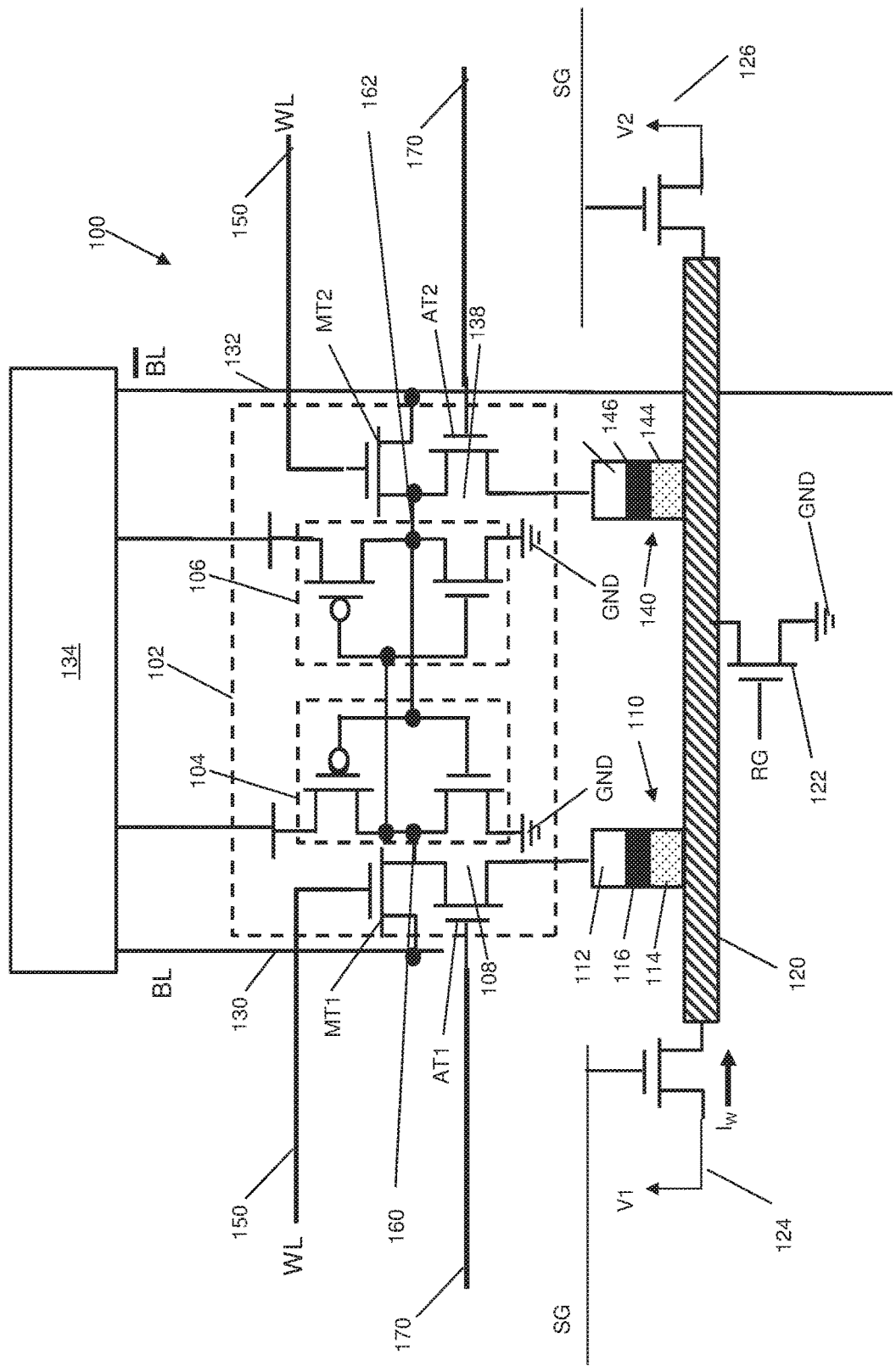
FIG. 3 shows a schematic view of a circuit structure according to still further embodiments of the disclosure.

Referring now to FIG. 3, further embodiments of the disclosure may structurally integrate first diode 108 and/or second diode 138 into other components, e.g., a first access transistor AT1 and a second access transistor AT2. In an electrical circuit, the channel region connecting a transistor's source to a drain may operate identically to a diode when at least a threshold voltage is applied to the gate of the transistor. First access transistor AT1 may include first diode 108 between its source and drain terminals, such that first diode 108 electrically couples first inverter 104 to first MRAM stack 110. Second access transistor AT2, similarly, may include second diode 138 across its source and drain terminals. Thus, second diode of second access transistor 138 may electrically couple second inverter 106 to second MRAM stack 140. Each access transistor AT1, AT2 may be coupled at its gate to a word line 150. Word line 150 may have a word line voltage $V_W$, which can be adjusted between a high or low value to enable or disable current flow across access transistor(s) AT1, AT2. When current flow across access transistors AT1, AT2 is enabled, an operator of structure 100 may selectively transmit write current $I_W$ through spin Hall electrode 120 to replicate data from latch 102 into MRAM stack(s) 110, 140 (as previously described in reference to FIG. 2). When current flow across access transistors AT1, AT2 is disabled, MRAM stack(s) 110, 140 may be electrically isolated from latch 102 as data is written to, or read from, first latch and/or second inverter 104, 106.

Figure 4:
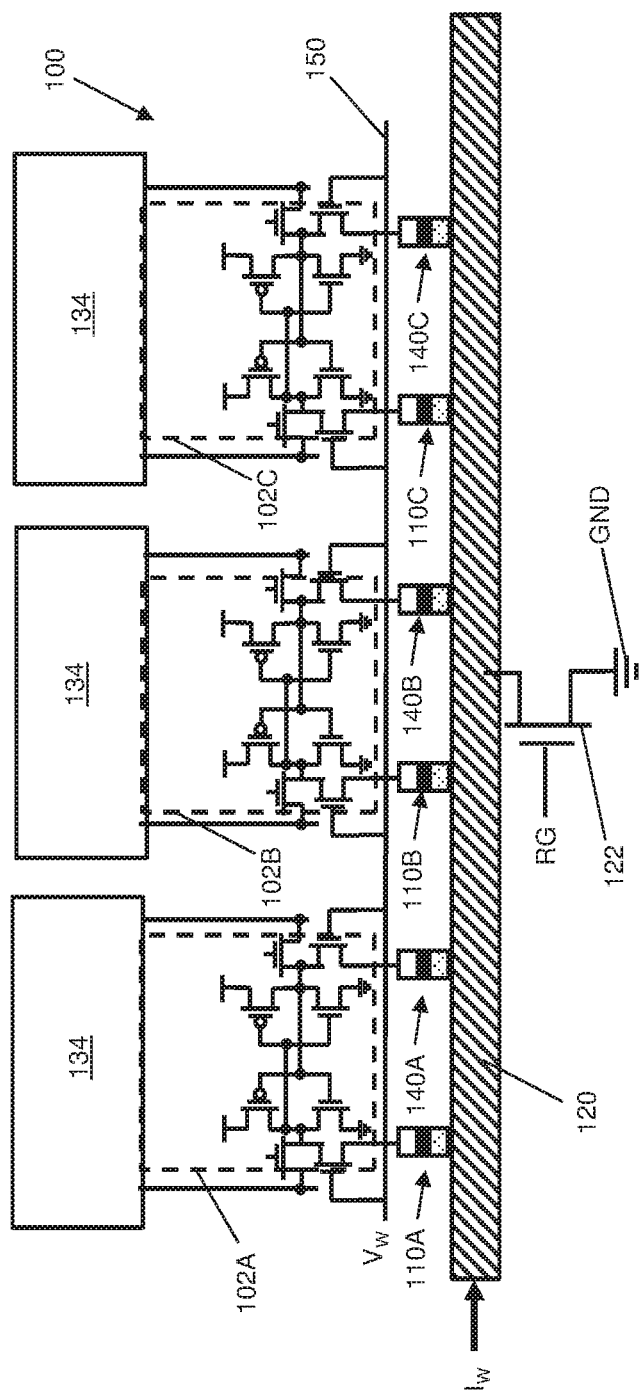
FIG. 4 shows a schematic view of a circuit structure with multiple memory cells and magnetic random access memory (MRAM) stacks according to embodiments of the disclosure.

Referring now to FIG. 4, embodiments of the disclosure may provide for MRAM stacks 110, 140 to store data from multiple latches 102 using one spin Hall electrode 120. In one such configuration, structure 100 may include a first latch 102A, a second latch 102B, and a third latch 102C. First latch 102A may be coupled to spin Hall electrode 120 through a first set of MRAM stacks 110A, 140A. Latches 102B, 102C similarly may be coupled to spin Hall electrode 120 through respective sets of MRAM stacks (110B and 140B, 110C and 140C). Structure 100 optionally may include more or fewer than three latches 102, and three are shown in FIG. 4 solely to provide an example.

Each latch 102A, 102B, 102C may be coupled to a respective component 134 (or, alternatively, the same component) for driving the operation of latch(es) 102, in the same manner as any of FIGS. 1-3 described herein. By transmitting write current $I_W$ through spin Hall electrode 120 while also applying a voltage to word line 150, data in each latch 102A, 102B, 102C may be replicated simultaneously in each MRAM stack 110A, 140A, 110B, 140B, 110C, 140C. In further configurations, structure 100 may include multiple spin Hall electrodes 120 and word lines 150 each in communication with a single set of latches 102 and MRAM stacks 110, 140. In this case, an operator of structure 100 may select only one set of latches 102 to have digital bits stored in corresponding MRAM stack(s) 110, 140 by applying a voltage $V_W$ to word line 150 and write current $I_W$ to spin Hall electrode 120.

Embodiments of the disclosure provide various technical and commercial advantages, some of which are described herein as examples. As noted herein, embodiments of structure 100 combine multiple forms of RAM (i.e., electrical and magnetic RAM) to replicate previously-stored data with minimal penalties to the surface area and operating energy of a device. The use of spin Hall electrode 120, moreover, allows the same combination of elements to be used for checkpointing of data from latch 102 into MRAM stack(s) 110, 140, and for restoring the checkpointed data to latch 102 after a power cycle of a device. Embodiments of the disclosure can easily be integrated into popular circuit schematics, e.g., by inserting MRAM stack(s) 110, 140 and spin Hall electrode 120 at the electrical connections to word line 150 where applicable, or otherwise near the location of an existing latch 102. The use of bistable MRAM stacks 110, 140, in particular, allows an electrically-recorded "zero" or "one" in latch(es) 102 to be replaced as a parallel or antiparallel magnetic moment of second layer 114 or fourth layer 144 with little to no risk of errors during checkpoint and restore operations.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
   a latch having a first inverter and configured to store a digital bit;
   a first switch coupled to the first inverter of the latch;
   a first magnetic random access memory (MRAM) stack coupled to the first inverter of the latch through the first switch, the first MRAM stack including:
      a first layer and a second layer each having a respective magnetic moment, wherein the magnetic moment of the second layer is adjustable between a parallel orientation and an antiparallel orientation with respect to the magnetic moment of the first layer; and
   a spin Hall electrode coupled to the first MRAM stack, and between a pair of switches for selectively applying a write current through the spin Hall electrode, wherein a magnitude of the write current induces a spin Hall transfer to the second layer to store the digital bit from the latch in the first MRAM stack.

2. The circuit structure of claim 1, wherein a material composition of the second layer is structured to adjust the magnetic moment in response to an applied voltage.

3. The circuit structure of claim 1, wherein the switch includes an access transistor coupled between the first inverter of the latch and the first layer of the first MRAM stack.

4. The circuit structure of claim 1, wherein the second layer of the first MRAM stack contacts and overlies the spin Hall electrode.

5. The circuit structure of claim 1, wherein the spin Hall electrode comprises at least one metal having a density of at least approximately five grams per cubic centimeter ($g/cm^3$).

6. The circuit structure of claim 1, wherein the latch includes a static random access memory (SRAM) circuit having the first inverter and a second inverter and configured to store an additional digital bit.

7. The circuit structure of claim 6, further comprising:
   a second switch coupled to the second inverter; and
   a second MRAM stack coupled to the second inverter of the latch through the second switch, the second MRAM stack including:
      a third layer, and
      a fourth layer between the third layer and the spin Hall electrode,
      wherein the third layer and the fourth layer each have a respective magnetic moment, and the magnetic moment of the fourth layer is adjustable between a parallel orientation and an antiparallel orientation with respect to the magnetic moment of the third layer, and wherein the magnitude of the write current induces a spin Hall transfer to the fourth layer to store the additional digital bit from the latch in the second MRAM stack.

8. The circuit structure of claim 7, further comprising:
   a first access transistor coupled between the first inverter of the latch and the first layer of the first MRAM stack, wherein the first switch is between a source terminal and a drain terminal of the first access transistor;
   a second access transistor coupled between the second inverter of the latch and the third layer of the second MRAM stack, wherein the second switch is between a source terminal and a drain terminal of the second access transistor; and
   a word line coupled to a gate terminal of the first access transistor and a gate terminal of the second access transistor.

9. The circuit structure of claim 1, further comprising a restore transistor electrically coupled between the spin Hall electrode and ground.

10. A circuit structure comprising:
    a static random access memory (SRAM) cell having a first inverter configured to store a first logic voltage and a second inverter configured to store a second logic voltage;
    a first magnetic random access memory (MRAM) stack coupled to the first inverter of the SRAM cell through a first access transistor;

a second MRAM stack coupled to the second inverter of the SRAM cell through a second access transistor, wherein each of the first MRAM stack and the second MRAM stack include:
- a first layer and a second layer each having a respective magnetic moment, wherein the magnetic moment of the second layer is adjustable between a parallel orientation and an antiparallel orientation with respect to the magnetic moment of the first layer, in response to an applied voltage; and
- a spin Hall electrode coupled to the first MRAM stack and the second MRAM stack, and between a pair of switches for selectively applying a write current through the spin Hall electrode, wherein a magnitude of the write current induces a spin Hall transfer to the second layer of each MRAM stack to store the first logic voltage in the first MRAM stack, and the second logic voltage in the second MRAM stack.

11. The circuit structure of claim 10, wherein each of the first MRAM stack and the second MRAM stack contacts and overlies the spin Hall electrode.

12. The circuit structure of claim 10, wherein the spin Hall electrode comprises at least one metal having a density of at least approximately five grams per cubic centimeter ($g/cm^3$).

13. The circuit structure of claim 10, further comprising a restore transistor electrically coupled between the spin Hall electrode and ground.

14. The circuit structure of claim 10, further comprising a word line coupled to a gate terminal of the first access transistor and a gate terminal of the second access transistor, wherein the word line selectively enables current flow across the first access transistor and the second access transistor.

15. A method for recording data within an integrated circuit (IC) structure, the method comprising:
   providing a circuit structure including:
   a plurality of latches electrically coupled to another component of the IC structure, and configured to store a plurality of digital bits,
   a first plurality of magnetic random access memory (MRAM) stacks coupled to one of the plurality of latches, each MRAM stack of the first plurality of MRAM stacks including:
   - a first layer having a first magnetic moment in a first orientation, and
   - a second layer on the first layer, and having a second magnetic moment adjustable between the first orientation and a second orientation opposite the first orientation, in response to an applied voltage, and
   a spin Hall electrode directly coupled to each MRAM stack of the first plurality of MRAM stacks, wherein each of the first plurality of MRAM stacks is coupled between the spin Hall electrode and one of the plurality of latches;
   transmitting a read current from the memory cell to a selected one of the first plurality of MRAM stacks; and
   transmitting a write current across the spin Hall electrode, wherein transmitting the write current records the plurality of digital bits from the plurality of latches within the first plurality of MRAM stacks.

16. The method of claim 15, further comprising:
   electrically disconnecting the memory cell from the another component of the IC structure; and
   electrically coupling the spin Hall electrode to ground, wherein electrically coupling the spin Hall electrode to ground records the plurality of digital bits of the first plurality of MRAM stacks within the plurality of latches.

17. The method of claim 15, wherein transmitting the read current includes applying a voltage to an access transistor coupled between the memory cell and one of the first plurality of MRAM stacks.

18. The method of claim 15, further comprising transmitting a data current to an inverter of the memory cell after transmitting the read current.

19. The method of claim 18, further comprising transmitting a reference current to a portion of the latch while transmitting the read current.

* * * * *